(12) United States Patent
Nagata

(10) Patent No.: US 10,934,618 B2
(45) Date of Patent: Mar. 2, 2021

(54) SUBSTRATE PROCESSING APPARATUS, SUBSTRATE LOADING METHOD, AND SUBSTRATE PROCESSING METHOD

(71) Applicant: TOKYO ELECTRON LIMITED, Tokyo (JP)

(72) Inventor: Tomoyuki Nagata, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/601,781

(22) Filed: Oct. 15, 2019

(65) Prior Publication Data

US 2020/0115796 A1   Apr. 16, 2020

(30) Foreign Application Priority Data

Oct. 16, 2018   (JP) .............................. JP2018-195404

(51) Int. Cl.
  *H01L 21/677*   (2006.01)
  *H01L 21/673*   (2006.01)
  *C23C 16/44*   (2006.01)

(52) U.S. Cl.
  CPC .... *C23C 16/4412* (2013.01); *H01L 21/67303* (2013.01); *H01L 21/67772* (2013.01); *H01L 21/67781* (2013.01)

(58) Field of Classification Search
  CPC ......... H01L 21/67303; H01L 21/67781; C23C 16/4412
  See application file for complete search history.

(56) References Cited

U.S. PATENT DOCUMENTS

| | | | |
|---|---|---|---|
| 10,475,641 B2* | 11/2019 | Fukushima | ....... C23C 16/45546 |
| 10,593,572 B2* | 3/2020 | Saido | ......................... F27B 9/30 |
| 2010/0032425 A1* | 2/2010 | Shimada | ........... H01L 21/67109 219/439 |
| 2011/0303152 A1* | 12/2011 | Asari | ................. H01L 21/67303 118/725 |
| 2015/0197851 A1* | 7/2015 | Yoon | .................... C23C 16/4584 118/723 I |
| 2018/0182652 A1* | 6/2018 | Seshimo | ........... H01L 21/67781 |
| 2018/0202043 A1* | 7/2018 | Sasaki | ................ C23C 16/45578 |
| 2018/0265294 A1* | 9/2018 | Hayashi | ............... H01L 21/6773 |
| 2019/0024232 A1* | 1/2019 | Kosugi | ............. H01L 21/67109 |
| 2019/0228992 A1* | 7/2019 | Oikawa | .................. C23C 16/045 |
| 2019/0287829 A1* | 9/2019 | Saido | ................ H01L 21/67303 |
| 2019/0309420 A1* | 10/2019 | Oikawa | ............. H01L 21/02505 |
| 2019/0333789 A1* | 10/2019 | Inoue | ................ H01L 21/67757 |
| 2020/0058526 A1* | 2/2020 | Iriuda | ............... H01L 21/67309 |

FOREIGN PATENT DOCUMENTS

JP   2018-46114 A   3/2018

* cited by examiner

*Primary Examiner* — Kaitlin S Joerger
(74) *Attorney, Agent, or Firm* — Nath, Goldberg & Meyer; Jerald L. Meyer

(57) ABSTRACT

There is provided a substrate processing apparatus, including: a cylindrical reaction tube having a lower end opening; a lid configured to open and close the lower end opening of the reaction tube; a substrate holder mounted on the lid and configured to hold a plurality of substrates at vertical intervals in multiple stages; and an inner tube mounted on the lid and configured to cover the substrate holder.

16 Claims, 10 Drawing Sheets

When wafer is transferred

When lid is closed

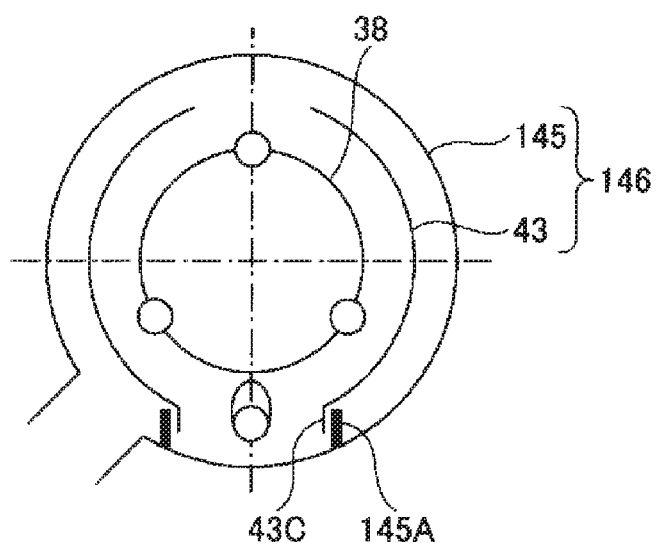

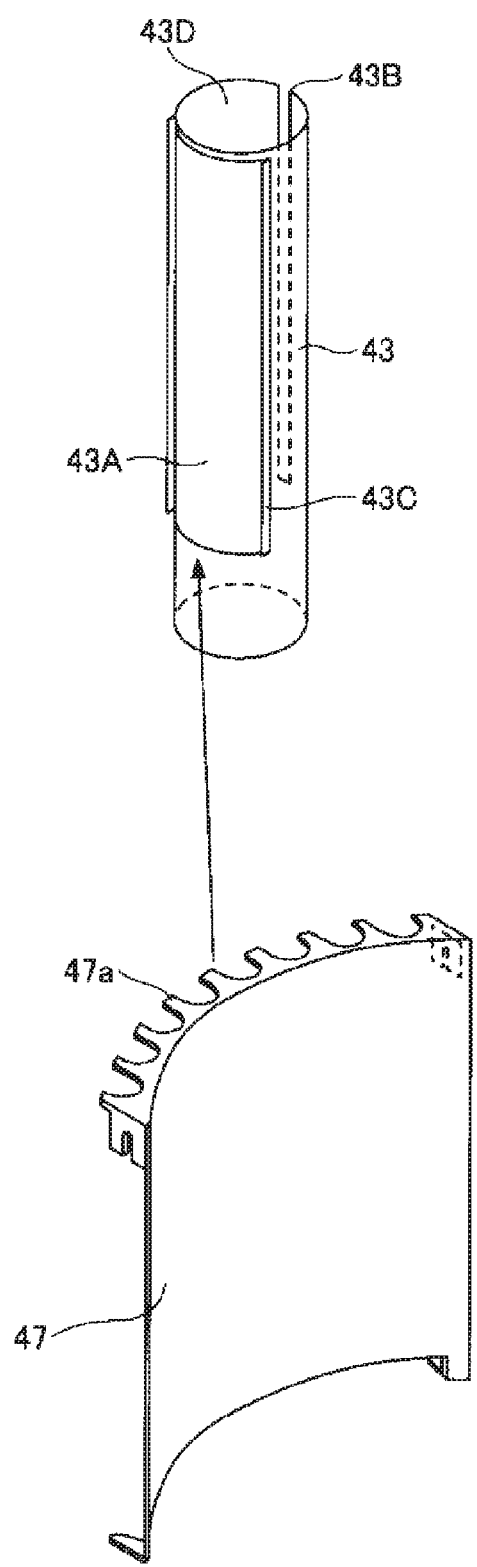

SUBSTRATE PROCESSING APPARATUS, SUBSTRATE LOADING METHOD, AND SUBSTRATE PROCESSING METHOD

CROSS-REFERENCE TO RELATED APPLICATION

This application is based upon and claims the benefit of priority from Japanese Patent Application No. 2018-195404, filed on Oct. 16, 2018, the entire contents of which are incorporated herein by reference.

TECHNICAL FIELD

The present disclosure relates to a substrate processing apparatus, a substrate loading method, and a substrate processing method.

BACKGROUND

Conventionally, there is known a substrate processing apparatus which includes an inner tube that accommodates a plurality of substrates, an outer tube that surrounds the inner tube, a movable wall that is movably provided inside the inner tube or between the inner tube and the outer tube, an injector that supplies a processing gas toward the substrates, and an exhaust means that exhausts the processing gas supplied toward the substrates. A first opening portion is formed in a sidewall of the inner tube. A second opening portion is formed in the movable wall. The exhaust means exhausts the processing gas supplied toward the substrates through the first opening portion and the second opening portion (for example, see Patent Document 1).

PRIOR ART DOCUMENT

Patent Documents

Patent Document 1: Japanese Laid-Open Patent Publication No. 2018-046114

SUMMARY

According to one embodiment of the present disclosure, there is provided a substrate processing apparatus, including: a cylindrical reaction tube having a lower end opening; a lid configured to open and close the lower end opening of the reaction tube; a substrate holder mounted on the lid and configured to hold a plurality of substrates at vertical intervals in multiple stages; and an inner tube mounted on the lid and configured to cover the substrate holder.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a cross-sectional view illustrating an example of a substrate processing apparatus according to a second embodiment of the present disclosure.

FIG. 10 is a view illustrating an example of a substrate processing apparatus according to a third embodiment of the present disclosure.

DETAILED DESCRIPTION

Modes for carrying out the present disclosure will now be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment 1

Figure 1:
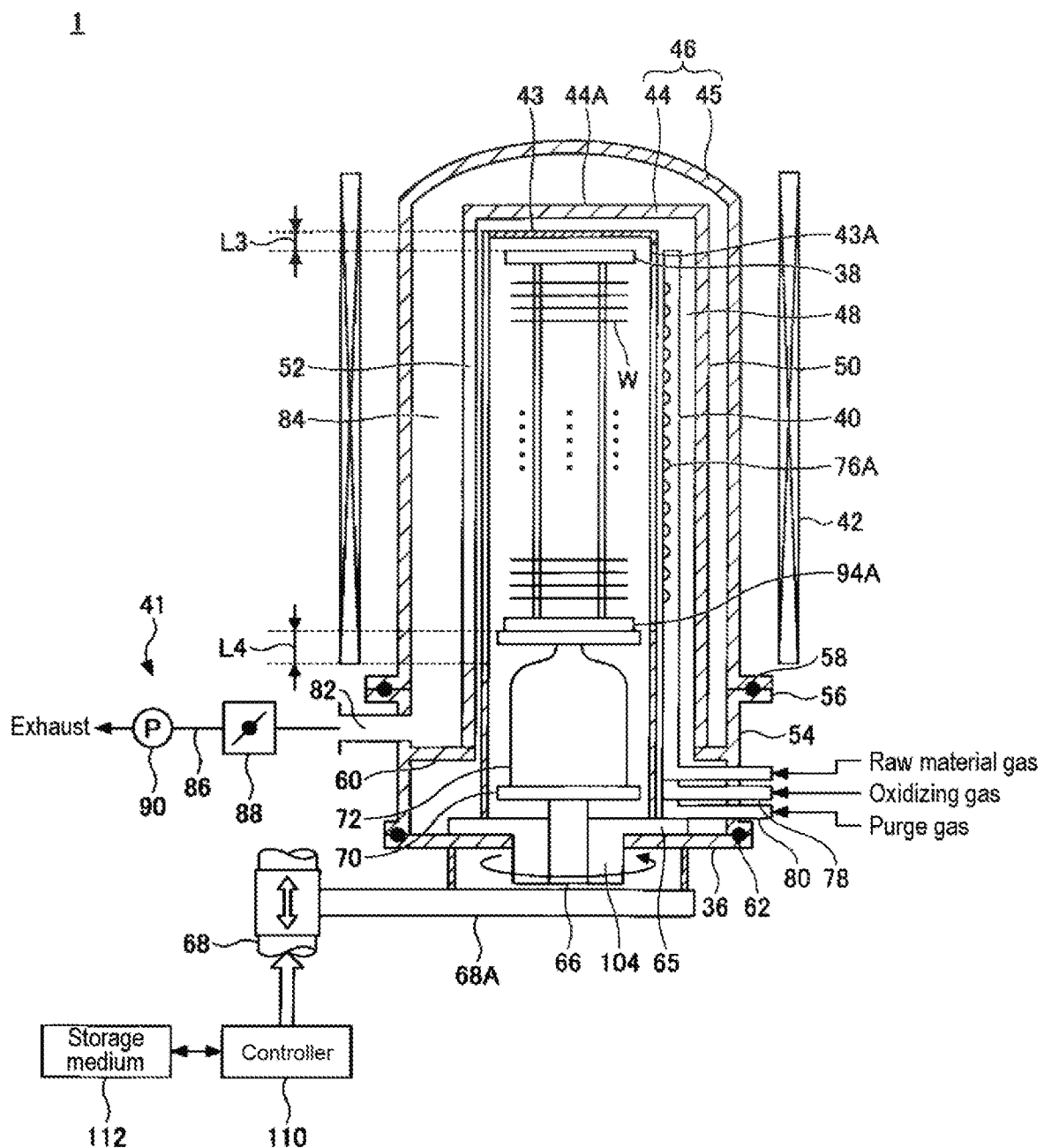
FIG. 1 is a schematic view of a substrate processing apparatus according to a first embodiment of the present disclosure.

A substrate processing apparatus according to a first embodiment of the present disclosure will be described. FIG. 1 is a schematic view of the substrate processing apparatus according to the first embodiment.

As illustrated in FIG. 1, a substrate processing apparatus 1 includes a reaction tube 46 that accommodates semiconductor wafers (hereinafter, referred to as "wafers W") as substrates, a lid 36 that airtightly closes a lower end opening portion of the reaction tube 46, a wafer boat 38 as a substrate holder that holds the plurality of wafers W at predetermined intervals and is loaded into and unloaded from the reaction tube 46, an injector 40 for introducing a predetermined gas into the reaction tube 46, an exhaust device 41 for exhausting a gas in the reaction tube 46, and a heater 42 for heating the wafers W.

The reaction tube 46 includes a cylindrical inner tube 43 having a ceiling portion, of which its lower end is opened, a cylindrical center tube 44 having a ceiling portion, of which its lower end is opened, and covering the outside of the inner tube 43, and a cylindrical outer tube 45 having a ceiling portion and covering the outside of the center tube 44. The inner tube 43, the center tube 44, and the outer tube 45 are made of a heat-resistant material such as quartz or the like, and are arranged in a coaxial relationship with each other to have a triple tube structure.

The ceiling portion of the inner tube 43 may be flat. A supply opening 43A is formed in a region facing the injector 40 in the inner tube 43. The inner tube 43 does not accommodate the injector 40, but is provided inward of the injector 40. A processing gas supplied from the injector 40 is supplied into the inner tube 43 through the supply opening 43A.

The injector 40 is provided so as to vertically extend along the inner tube 43. The injector 40 is provided outside the inner tube 43. The center tube 44 surrounding the inner tube 43 and the injector 40 is provided to prevent diffusion of the processing gas.

Figure 2:
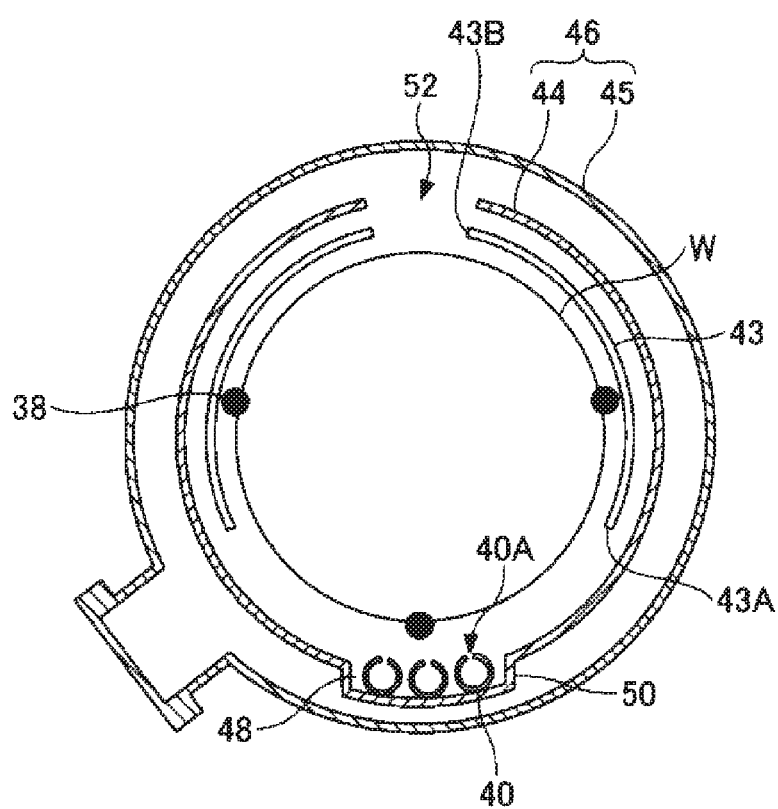
FIG. 2 is a transverse cross-sectional view illustrating a reaction tube of the substrate processing apparatus shown in FIG. 1.

FIG. 2 is a transverse cross-sectional view illustrating the reaction tube of the substrate processing apparatus in FIG. 1. As illustrated in FIG. 2, the inner tube 43 includes the supply opening 43A formed widely in the region facing the injector 40. In addition, an exhaust opening 433 having a narrower width than the supply opening 43A is formed at the opposite side of the supply opening 43A. The inner tube 43 is provided close to the outer shape of the wafer W.

The center tube 44 includes a nozzle accommodation portion 48 in which the injector 40 is accommodated along a longitudinal direction (vertical direction). In the first embodiment, as illustrated in FIG. 2, a portion of the sidewall of the center tube 44 protrudes outward to form a protruded portion 50. The interior of the protruded portion 50 is formed as the nozzle accommodation portion 48.

Figure 3:
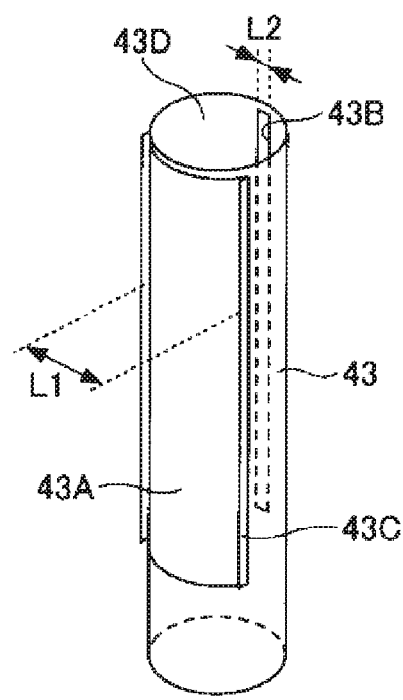
FIG. 3 is a perspective view illustrating an example of an inner tube.

FIG. 3 is a perspective view illustrating an example of the inner tube 43. As illustrated in FIG. 3, the inner tube 43 has a supply opening 43A with a width L1 and an exhaust opening 43B with a width L2. The reason why the supply opening 43A is larger compared to the exhaust opening is to transfer the wafers W into the wafer boat 38 provided in the inner tube 43 through the supply opening 43A. That is to say, the supply opening 43A of the inner tube 43 serves not only as an hole for introducing the processing gas supplied from the injector 40 into the inner tube 43 therethrough, but also as a loading/unloading hole through which the wafers W are transferred. Therefore, the supply opening 43A is required to have the width L1 larger than the diameter of the wafers W in order to avoid contact with the wafers W and the inner tube 43 at the time of transferring the wafers W. Thus, the supply opening 43A has the wider width.

Furthermore, a vertical length of the supply opening 43A may be set to cover a range in which the wafers W are mounted in the wafer boat 38 in multiple stages so that the processing gas supplied from the injector 40 is directly supplied toward the wafers W. That is to say, an upper end of the supply opening 43A may be set at a position higher than the wafer W mounted on the uppermost stage of the wafer boat 38 and a lower end thereof may be set at a position lower than the wafer W mounted on the lowermost stage of the wafer boat 38.

The inner tube 43 has the exhaust opening 43B formed at the opposite side of the supply opening 43A. When substrate processing is performed inside the reaction tube 46, it is preferable that the processing gas supplied from the injector 40 flows in the form of a laminar flow in a substantially parallel relationship with respective surfaces of the wafers W. This makes it possible to widely spread the processing gas not only toward positions near the injector 40 in the wafers W but also toward positions at the opposite side of the injector 40 in the wafers W, thereby improving in-plane uniformity of the substrate processing. In order to form such a laminar flow, it is preferable that exhaust is performed at the opposite side of the injector 40 to form a substantially horizontal parallel flow. To do this, as illustrated in FIG. 1, the substrate processing apparatus 1 is configured such that the exhaust opening 43B is formed at the opposite side of the injector 40. In addition, a gas outlet 82 is provided at the opposite side of the exhaust opening 43B and at a position close to the supply opening 43A. By providing the gas outlet 82 away from the exhaust opening 43B, it is possible to alleviate a tendency for the exhaust to be stronger in a lower region of the wafer boat 38 and to form a more uniform laminar flow. Similar to the supply opening 43A, a vertical length of the exhaust opening 43B may be set to such a length that covers from the upper stage to the lower stage of the wafers W mounted on the wafer boat 38, and be set to a height equal to that of the supply opening 43A. This is because the supply side and the exhaust side of the processing gas can be in a relationship where they correspond with each other to easily form the laminar flow.

An inner surface of the inner tube 43 may be located as close as possible to the wafer boat 38. The inner tube 43 serves to prevent diffusion of the processing gas supplied from the injector 40 and to stay the processing gas on the wafers W and around the wafers W. This makes it possible to efficiently adsorb the processing gas onto the respective surfaces of the wafers W. If the distance between the inner tube 43 and the wafer boat 38 is away from each other, the processing gas is likely to be diffused, thus reducing the amount of adsorption of the processing gas onto the wafers W. The inner tube 43 is basically provided to prevent the diffusion of the processing gas. However, as the distance between the inner tube 43 and the wafers W becomes shorter, the effects of preventing the diffusion of the processing gas and promoting the adsorption of the processing gas onto the respective surfaces of the wafers W are increased. Therefore, the shape of the inner surface of the inner tube 43 may be formed in conformity to an outer shape of the wafer boat 38. A clearance between the inner tube 43 and the wafer boat 38 may be set to 9 mm or less, specifically 7 mm or less, more specifically 6 mm or less. In the substrate processing apparatus 1 according to the present embodiment, the clearance may be set to 5 mm.

This is because both the inner tube 43 and the wafer boat 38 are provided on the lid 36 from the beginning. That is to say, in a conventional substrate processing apparatus, an inner tube is provided in a reaction tube. In this case, the wafer boat and the inner tube are required to be provided in consideration of both an assembly error at the side of the reaction tube and an assembly error at the side of a lid. This limits the distance between the wafer boat and the inner tube.

However, in the substrate processing apparatus 1 according to the present embodiment, both the wafer boat 38 and the inner tube 43 may be provided in consideration of only an assembly error at the side of the lid 36. That is to say, as illustrated in FIG. 1, a rotary shaft 104 is provided in a coaxial relationship with a rotary shaft 66 of the lid 36, and the inner tube 23 is mounted on a rotary table 65. Furthermore, the wafer boat 38 is supported on a rotary plate 70 provided on the rotary shaft 66 through a heat insulating tube 72. In other words, both the wafer boat 38 and the inner tube 43 have centers coinciding with the rotary shaft 66 so that only assembly errors with respect to the rotary shaft 66 are required to be taken into consideration. Thus, the assembly errors are quite small, which makes it possible to arrange the wafer boat 38 and the inner tube 43 while leaving a small clearance therebetween.

Moreover, in the substrate processing apparatus according to the present embodiment, since the wafer boat 38 is provided inside the inner tube 43 from the beginning, or the wafer boat 38 is covered with the inner tube 43 from the beginning, the clearance can be set in a stationary state. This makes it possible to set the clearance as small as possible. Conventionally, since the insert movement of the wafer boat 38 into the inner tube 43 is required, it is necessary to consider a clearance that can allow the insert movement. Thus, there is a limit in reducing the clearance. On the other hand, in the present embodiment, the clearance can be initially set and a subsequent relative movement is performed in a coaxial relationship. This makes it possible to significantly reduce an error caused by the relative movement.

The inner tube 43 has protruded surfaces 43C formed at end portions of both sides of the supply opening 43A. The protruded surfaces 43C functions as a baffle plate that is provided to cover both sides of the injector 40 and to prevent the processing gas supplied from the injector 40 from diffusing in the lateral direction. The formation of the protruded surfaces 43C at both sides of the supply opening 43A is not essential. However, it is preferable to form the protruded surfaces 43C as much as possible from the viewpoint of preventing the diffusion of the processing gas. As illustrated in FIG. 3, the protruded surfaces 43C may be formed over the whole range from an upper end to a lower end of the supply opening 43A in the vertical direction.

In some embodiments, the inner tube 43 may further have an upper surface 43D from the viewpoint of preventing the diffusion of the processing gas.

As described above, it is possible to effectively prevent the diffusion of the processing gas by performing the assembly of the wafer boat 38 and the inner tube 43 with respect to the rotary shaft 66 in a coaxial relationship with the wafer boat 38 and the inner tube 43 and installing the inner tube 43 so as to be close to the outer shape of the wafer boat 38 and the wafers W in a conformal manner.

Figure 4:
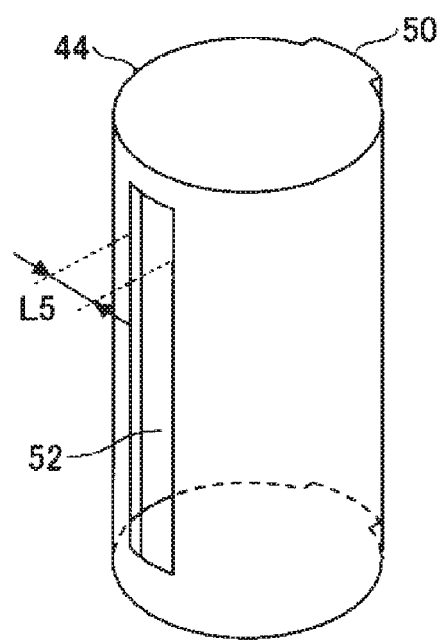
FIG. 4 is a perspective view illustrating an example of a center tube.

FIG. 4 is a perspective view illustrating an example of the center tube 44. Similar to the inner tube 43, as illustrated in FIG. 4, a rectangular exhaust opening portion 52 of width L5 is formed in a sidewall facing the nozzle accommodation portion 48 in the center tube 44 along its longitudinal direction (vertical direction).

The exhaust opening portion 52 is a gas exhaust port formed to exhaust the processing gas in the inner tube 43 therethrough. A length of the exhaust opening portion 52 is set equal to the length of the wafer boat 38 or to become elongated upward and downward beyond the length of the wafer boat 38. That is to say, an upper end of the exhaust opening portion 52 is located to extend to a height higher than a position corresponding to the upper end of the wafer boat 38, and a lower end of the exhaust opening portion 52 is located to extend to a height lower than a position corresponding to the lower end of the wafer boat 38. This is similar to the case of the exhaust opening 43B of the inner tube 43. Specifically, as illustrated in FIG. 1, a gap L3 in the height direction between the upper end of the wafer boat 38 and the upper end of the exhaust opening portion 52 may fall within a range of about 0 to 5 mm. Furthermore, a gap L4 in the height direction between the lower end of the wafer boat 38 and the lower end of the exhaust opening portion 52 may fall within a range of about 0 to 350 mm. In addition, the width L5 of the exhaust opening portion 52 may fall within a range of about 10 to 400 mm, specifically a range of about 40 to 200 mm.

The lower end of the reaction tube 46 may be supported by a cylindrical manifold 54 made of stainless steel. A flange portion 56 is formed on an upper end portion of the manifold 54. A lower end portion of the outer tube 45 is located and supported on the flange portion 56. A seal member 58 such as an O-ring or the like is provided between the flange portion 56 and the lower end portion of the outer tube 45 to make the interior of the outer tube 45 airtight.

A ring-shaped support part 60 is provided on an upper inner wall of the manifold 54. A lower end portion of the center tube 44 is mounted and supported on the support part 60. The lid 36 is airtightly attached to a lower end opening portion of the manifold 54 through a seal member 62 such as an O-ring or the like. Thus, the lower end opening portion of the reaction tube 46, namely the lower end opening portion of the manifold 54 is airtightly sealed. The lid 36 is made of, e.g., stainless steel.

The rotary shaft 66 is provided to penetrate the center of the lid 36. A lower portion of the lid 36 is supported by an arm 68A of an elevating means 68 including a boat elevator. The opening portion of the manifold 54 is opened or closed by the elevating means 68. Furthermore, the rotary shaft 66 is configured to be rotated by a motor 69 (see FIG. 5).

The rotary plate 70 is provided on an upper end of the rotary shaft 66. The wafer boat 38 configured to hold the wafers W is mounted on the rotary plate 70 through the heat insulating tube 72 made of quartz. Therefore, the lid 36 and the wafer boat 38 are integrally moved upward and downward by moving upward and downward the elevating means 68 so that the wafer boat 38 can be inserted into and removed from the reaction tube 46.

The injector 40 is provided in the manifold 54 to introduce a gas such as the processing gas, a purge gas or the like into the inner tube 43. The injector 40 is configured as a gas nozzle made of quartz. The injector 40 may include a plurality of (e.g., three) injectors 40. Each of the injectors 40 is provided in the inner tube 43 along its longitudinal direction. A base end portion of each injector 40 is bent in an L-like shape and penetrates the manifold 54 so that each injector 40 is supported by the manifold 54.

As illustrated in FIG. 2, the injectors 40 are provided in a row along the circumferential direction inside the nozzle accommodation portion 48 of the center tube 44. A plurality of gas holes 40A is formed in each injector 40 at predetermined intervals along its longitudinal direction so that each gas can be horizontally discharged from the respective gas holes 40A. The predetermined intervals may be set to be equal to those between the wafers W supported by the wafer boat 38. Furthermore, a height position of each gas hole 40a is set so that each gas hole 40A is located toward the middle between the wafers W adjacent to each other in the vertical direction. Thus, it is possible to efficiently supply each gas toward a space between the wafers W.

The gas may include a raw material gas, an oxidizing gas, and a purge gas. Each gas may be supplied through each injector 40 as necessary while controlling its flow rate. A silicon oxide film may be formed by an atomic layer deposition (ALD) method using a silicon-containing gas as the raw material gas, an ozone ($O_3$) gas as the oxidizing gas, and a nitrogen ($N_2$) gas as the purge gas. Furthermore, the gas to be used may be appropriately selected according to the kind of a film to be formed.

In addition, the gas outlet 82 is formed in an upper sidewall of the manifold 54 and above the support part 60. The gas in the inner tube 43 discharged from the exhaust opening 43B and the exhaust opening portion 52 through a space 84 between the center tube 44 and the outer tube 45 can be exhausted through the gas outlet 82. An exhaust device 41 is provided in the gas outlet 82. The exhaust device 41 has an exhaust passage 86 connected to the gas outlet 82. A pressure regulating valve 88 and a vacuum pump 90 are sequentially provided in the exhaust passage 86 so that the interior of the reaction tube 46 can be evacuated. The width L2 of the exhaust opening 43B and the width L5 of the exhaust opening portion 52 may be set to fall within a range of 10 to 400 mm to efficiently exhaust the gas in the inner tube 43.

The cylindrical heater 42 is provided at an outer peripheral side of the outer tube 45 so as to cover the outer tube 45 and is configured to heat the wafers W.

Furthermore, the rotary table 65 that supports the inner tube 43 is provided below the inner tube 43. As illustrated in FIG. 1, the rotary table 65 has a disc shape and is configured to mount the inner tube 43 on its upper surface.

The rotary shaft 104 is provided below the rotary table 65 so as to penetrate the lid 36. The rotary shaft 104 is configured to be movable (rotatable) by a motor 106 (see FIG. 5) independently of the rotary shaft 66. The position of the wafer boat 38 can be changed by rotating the rotary plate 70 with the rotation of the rotary shaft 66. With this configuration, it is possible to perform the substrate processing while rotating the wafer boat 38.

Figure 5:
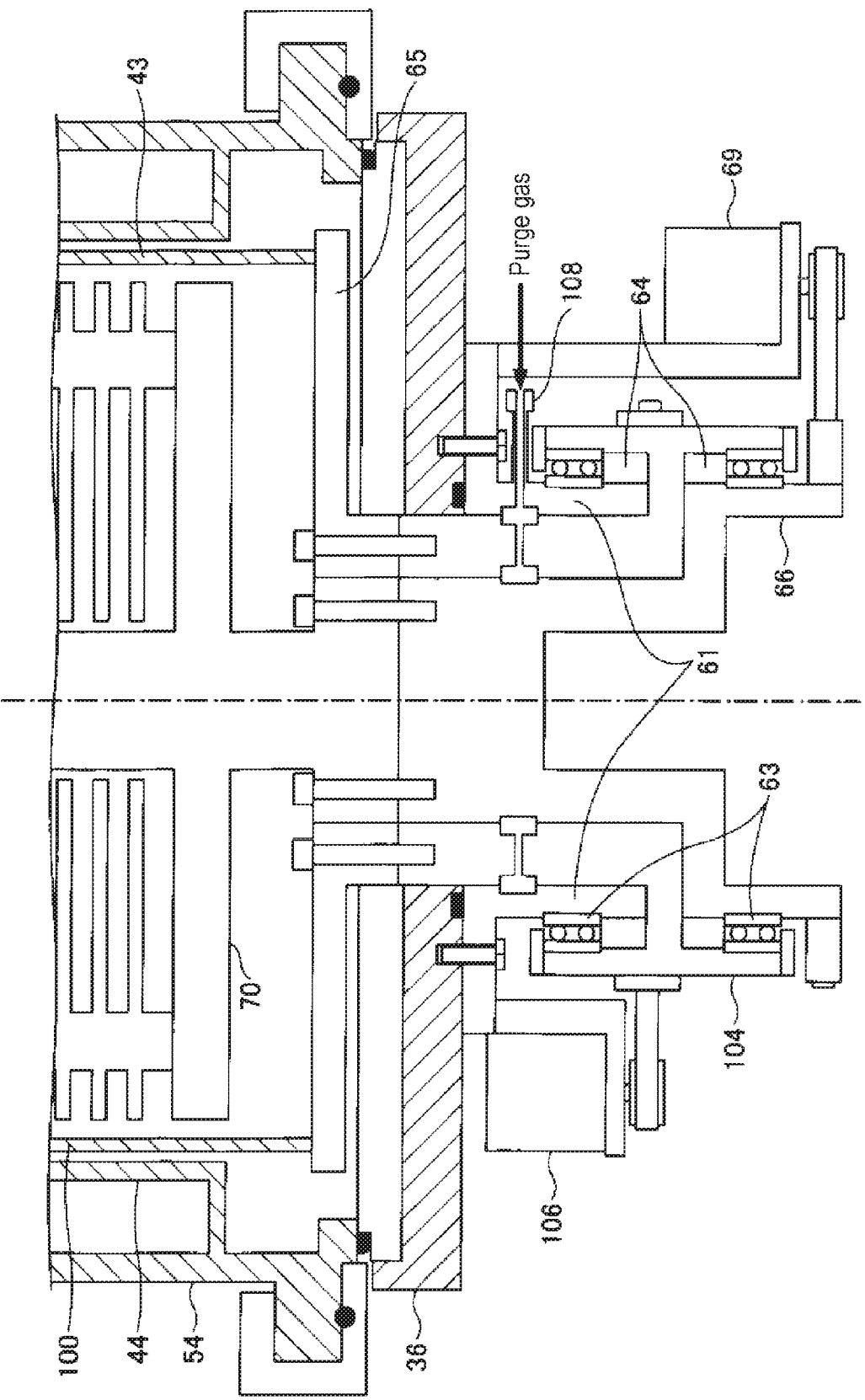
FIG. 5 is a longitudinal sectional view illustrating an example of a rotary mechanism for rotating a rotary table.

FIG. 5 is a longitudinal sectional view illustrating an example of a rotary mechanism of the rotary table 65. As illustrated in FIG. 5, the rotary plate 70 and the rotary table 65 are configured so as to be rotatable independently of one another by the rotary shafts 66 and 104 as a dual shaft provided on the lid 36, respectively. Specifically, the rotary plate 70 is connected to the motor 69 via, the rotary shaft 66. A rotation speed and a rotation angle of the rotary shaft 66 are adjusted by the motor 69 such that the rotary plate 70 is rotated at a predetermined rotation speed by a predetermined rotation angle. The rotary table 65 is connected to the motor 106 via the rotary shaft 104. A rotation angle and a rotation speed of the rotary shaft 104 are adjusted by the motor 106 such that the rotary table 65 is rotated at a predetermined rotation speed by a predetermined rotation angle. The wafer boat 38 is oriented toward a transfer device provided at the side opposite the injector 40 when the wafers are transferred at a position below the reaction tube 46, and is oriented toward the injector 40 when the transfer operation is completed. Thus, it is only necessary to rotate the rotary table 65 by 180 degrees. In the case of reliably rotating the rotary table 65 by 180 degrees, there is no need to finely adjust the rotation speed or the like. Thus, the rotary table 65 can be set to rotate at a rotation speed at which the rotary table 65 operates in a reliable manner.

Furthermore, a purge gas flow path 108 is provided in a gap between the rotary shaft 66 and the rotary shaft 104 and a gap between the rotary shaft 66 and the lid 36, so as to supply a purge gas such as an $N_2$ gas or the like. Thus, it is possible to prevent the processing gas from entering the gap between the rotary shafts 66 and 104 and corroding the rotary shafts 66 and 104. In addition, bearing parts 63 having ball bearings and a magnetic fluid seal part 64 are provided between the rotary shaft 66 and the rotary shaft 104 and between the rotary shaft 66 and a housing 61 that fixes the rotary shaft 66 to the lid 36. By providing the magnetic fluid seal part 64, it is possible to prevent ambient air or dusts from entering into the reaction tube 46.

Returning to FIG. 1, an overall operation of the substrate processing apparatus 1 configured as above is controlled by a controller 110 including a computer or the like. A computer program for executing the overall operation stored in a storage medium 112. Examples of the storage medium 112 may include a flexible disk, a compact disc, a hard disk, a flash memory, a DVD, and the like.

Next, a substrate transfer method using the substrate processing apparatus according to the first embodiment will be described.

Figure 6:
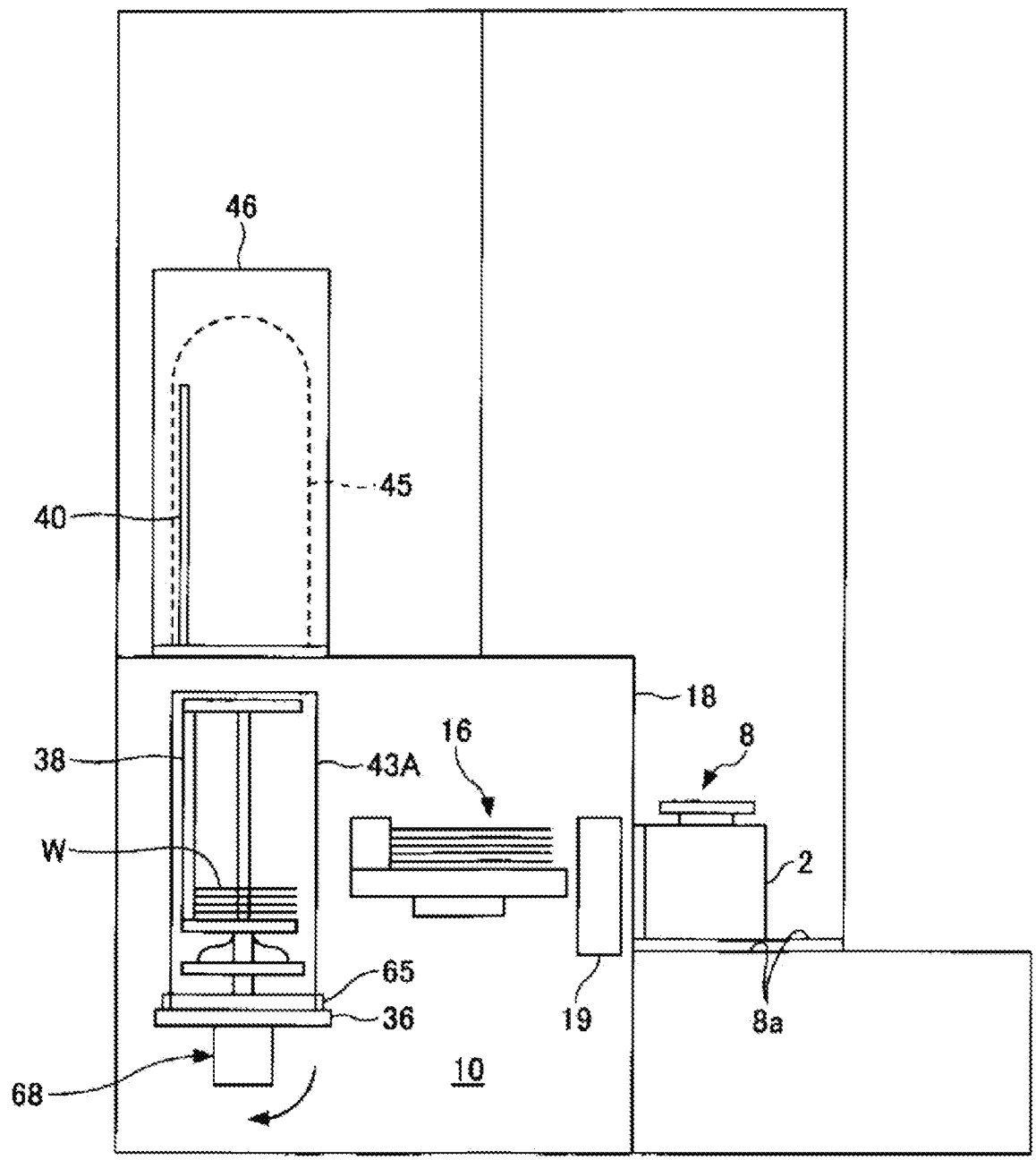
FIG. 6 is a view for explaining a substrate transfer method according to the first embodiment.

FIG. 6 is a view illustrating the substrate transfer method according to the first embodiment. In FIG. 6, a FIMS (front-opening interface mechanical standard) port 8, a substrate storage 2, a stage 8a, a partition wall 18, a door mechanism 19, and a transfer mechanism 16 are provided inside a substrate transfer region 10.

As illustrated in FIG. 6, the substrate storage 2 is mounted on the stage 8a, and subsequently, the door mechanism 19 is opened when the substrate storage 2 is brought into close contact with the partition wall 18. The wafers W are picked up by the transfer mechanism 16 and are transferred on the wafer boat 38 inside the inner tube 43 located at the side opposite the transfer mechanism 16. Therefore, the inner tube 43 receives the wafers W with the supply opening 43A oriented toward the transfer mechanism 16.

After the wafers W are transferred on the wafer boat 38, the rotary table 65 is rotated so that the supply opening 43A faces the injector 40.

When the lid 36 is raised in this state, the inner tube 43 can be inserted into the reaction tube 46 without interfering with the injector 40. Then, in a state where the rotation of the inner tube 43 is stopped, the processing gas is supplied from the injector 40 toward the inner tube 43 while rotating the wafer boat 38, so that the substrate processing is appropriately performed. At this time, since the wafers W and the inner tube 43 are arranged such that they are in close contact with each other, the processing gas is efficiently supplied toward the wafers W. This improves a deposition rate and in-plane uniformity.

Figure 7A:
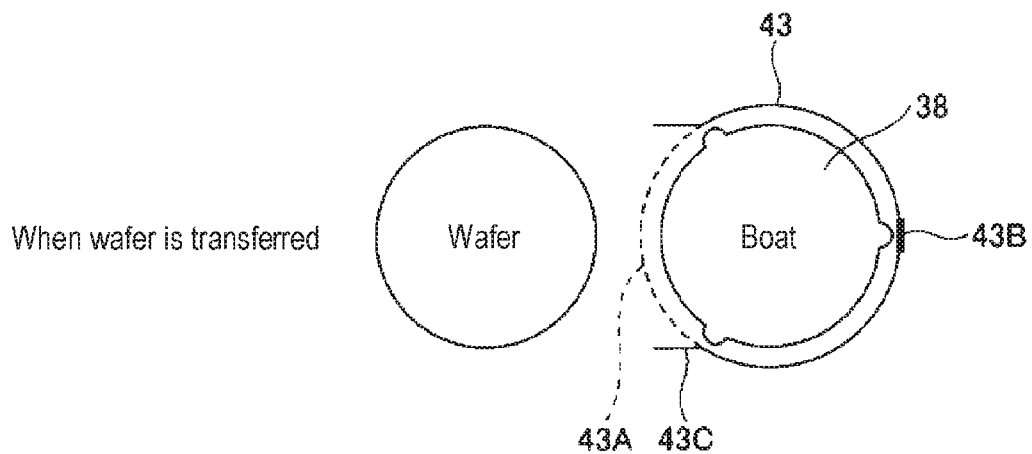
FIGS. 7A and 7B are plan views illustrating a substrate loading operation.
Figure 7B:
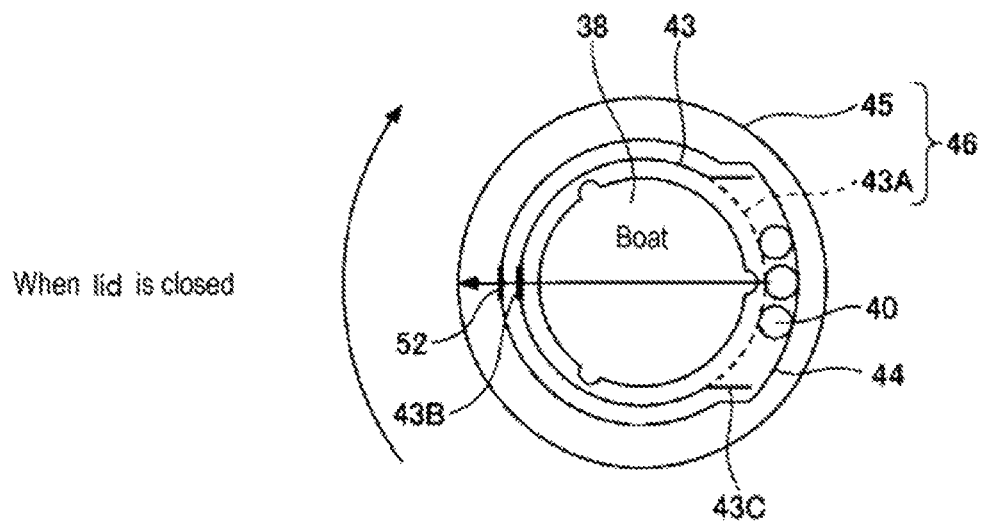

FIGS. 7A and 7B are plan views illustrating a substrate loading operation. FIG. 7A is a view illustrating a state when the wafer is transferred. As illustrated in FIG. 7A, when the wafer W is transferred, the supply opening 43A is required to be oriented toward the transfer mechanism 16 as described with reference to FIG. 6. Thus, the supply opening 43A faces the side of the transfer mechanism 16. The wafers W are transferred to the wafer boat 38 through the supply opening 43A.

FIG. 7B is a view illustrating a state in which the wafer boat 38 and the inner tube 43 are inserted into the center tube 44 after the transfer of the wafers W to the wafer boat 38. When all the wafers W are transferred to the wafer boat 38, the rotary table 65 is rotated so that the supply opening 43A of the inner tube 43 is oriented toward the injectors 40. Thereafter, the lid 36 is moved upward to insert the inner tube 43 into the center tube 44 in the reaction tube 46. Then, the inner tube 43 is arranged in conformity to the outer shape of the wafer boat 38, and the supply opening 43A is located at the front side of the injector 40. The protruded surfaces 43C cover the both sides of the injector 40 from right and left sides, thus suppressing the processing gas supplied from the injector 40 from diffusing to the right and left sides. Furthermore, the center tube 44 covers the supply opening 43A of the inner tube 43 with a continuous wall surface, thus preventing the diffusion of the processing gas.

This operation is performed by controlling the operation of the rotary shaft 104 provided on the lid 36 by the controller 110. Furthermore, the rotation operation of the wafer boat 38 during the substrate processing corresponds to the operation of the rotary shaft 66. Thus, the substrate processing is performed by controlling the operation of the rotary shaft 66 by the controller 110.

The exhaust opening 43B and the exhaust opening portion 52 are located at the side opposite the injector 40 to form a passage through which the processing gas supplied from the injector 40 is linearly moved and is exhausted through the exhaust opening 43B and the exhaust opening portion 52. This facilitates the flow of the processing gas as a laminar flow.

In some embodiments, the injectors 40 may be further provided according to the type of substrate processing. For example, in the case of forming a silicon oxide film, a silicon-containing gas, an oxidizing gas such as ozone or the like, a nitrogen gas for purging, and the like are necessary. Thus, at least three injectors 40 are necessary. In this manner, the number of injectors 40 may be determined according to the intended use.

Figure 8:
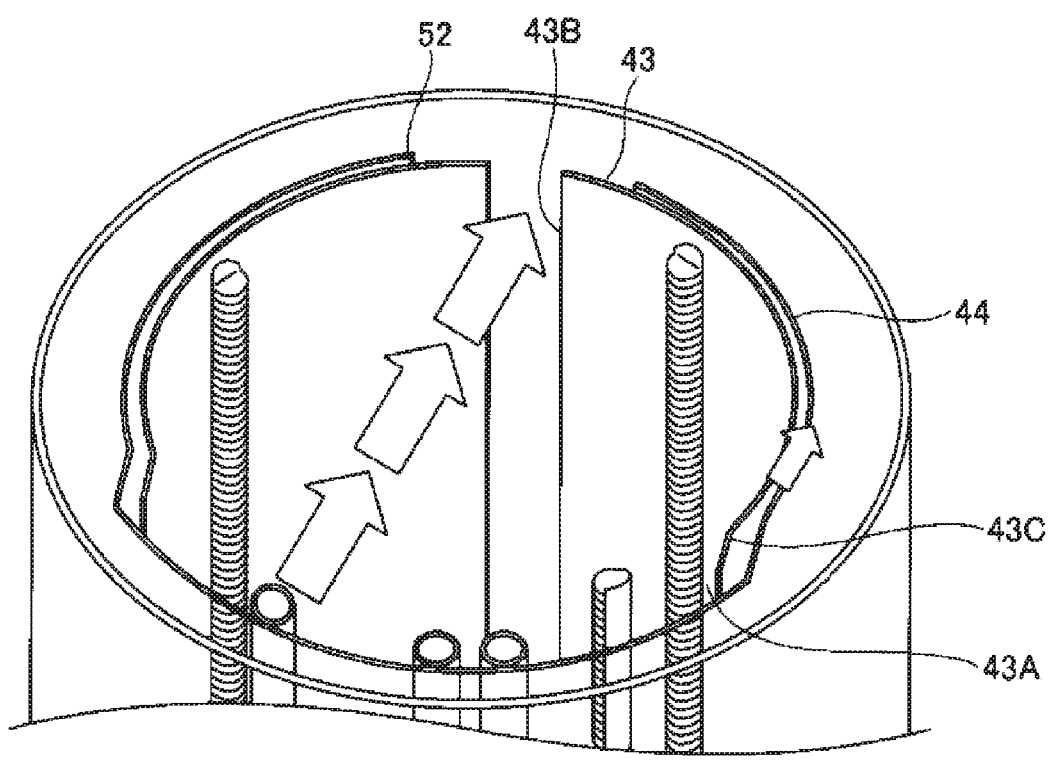
FIG. 8 is a perspective view illustrating a more detailed relationship between the inner tube and the center tube.

FIG. 8 is a perspective view illustrating a more detailed relationship between the inner tube 43 and the center tube 44. As illustrated in FIG. 8, the center tube 44 surrounds the inner tube 43. It is configured so that the protruded surfaces 43C of the inner tube 43 prevent the diffusion of the processing gas in the lateral direction, and the center tube 44 prevents the diffusion of the gas from a large opening of the supply opening 43A.

As described above, according to the substrate processing apparatus and the substrate processing method of the first embodiment, it is possible to prevent the diffusion of the processing gas by the center tube 44 and to efficiently supply the processing gas toward the wafers W.

Second Embodiment

FIG. 9 is a cross-sectional view illustrating an example of a substrate processing apparatus according to a second embodiment of the present disclosure. As illustrated in FIG. 9, in the substrate processing apparatus according to the second embodiment, the configuration of the inner tube 43 is similar to that of the substrate processing apparatus 1 according to the first embodiment, but is different from the first embodiment in that the center tube 44 is omitted.

In the substrate processing apparatus according to the second embodiment, the center tube 44 is not provided, but protruded walls 145A are provided outward of the protruded surfaces 43C of the inner tube 43 from an inner peripheral wall surface of an outer tube 145 so as to face the protruded surfaces 43C, respectively. The protruded walls 145A protrude from respective sides facing the protruded surfaces 43C. Thus, the combination of the protruded walls 145A has a shape constituting a labyrinth seal. Such a labyrinth seal suppresses outflow of the processing gas from the interior of the inner tube 43.

By implementing the labyrinth seal in this way, it is also possible to suppress the diffusion of the gas only by the combination of the outer tube 145 and the inner tube 43.

According to the substrate processing apparatus of the second embodiment, it is possible to prevent the outflow of the processing gas from the inner tube 43 with a simplified configuration.

Furthermore, a substrate loading method and a substrate processing method are similar to those of the first embodiment, and therefore, a description thereof will be omitted.

Third Embodiment

FIG. 10 is a view illustrating an example of a substrate processing apparatus according to a third embodiment of the present disclosure. The substrate processing apparatus according to the third embodiment has a configuration in which a gas release prevention member 47 is provided below the inner tube 43. The gas release prevention member 47 is provided to prevent the processing gas from releasing downward. The gas release prevention member 47 has a plurality of projections 47a formed on its surface to reduce the conductance of a downward flow path. Thus, the gas release prevention member 47 narrows the flow path of the processing gas to hamper the passage of the processing gas. That is to say, the plurality of protrusions 47a are provided so as to cover spaces between the respective injectors 40. For example, the gas release prevention member 47 may be provided below the supply opening 43A of the inner tube 43. This makes it possible to suppress the outflow of the processing gas below the supply opening 43A.

As illustrated in FIG. 10, the gas release prevention member 47 is configured as a separate member from the inner tube 43. The gas release prevention member 47 may be provided on the inner peripheral surface of the inner tube 43 or may be directly provided on the outer peripheral surface of the inner tube 43 by welding or the like. Alternatively, only the projections 47a may be directly fixed to the wall surface of the inner tube 43 below the supply opening 43A of the inner tube 43 by welding or the like.

In addition, in the case where the inner tube 43 is made of quartz, the gas release prevention member 47 may also be made of quartz as the same material.

Moreover, the substrate processing apparatus according to the third embodiment may also be configured in combination with both the first and second embodiments.

According to the present disclosure in some embodiments, it is possible to reduce a distance between an inner tube and a substrate holder.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a cylindrical reaction tube having a lower end opening;
   a lid configured to open and close the lower end opening of the reaction tube;
   a substrate holder mounted on the lid and configured to hold a plurality of substrates at vertical intervals in multiple stages; and
   an inner tube mounted on the lid and configured to cover the substrate holder,
   wherein the inner tube has a first opening through which the plurality of substrates is transferred into the substrate holder, and a second opening functioning as an exhaust port inside the cylindrical reaction tube, the first opening and the second opening being formed in a side surface of the inner tube at opposite sides from each other.

2. The apparatus of claim 1, wherein each of the first opening and the second opening has a vertically-elongated rectangular shape.

3. The apparatus of claim 1, wherein the second opening is smaller than the first opening.

4. The apparatus of claim 1, wherein an inner surface of the inner tube has a shape conforming to an outer shape of the substrate holder.

5. The apparatus of claim 1, wherein the lid comprises a first rotary shaft configured to rotate the substrate holder and a second rotary shaft configured to rotate the inner tube, and
   the first rotary shaft and the second rotary shaft have a rotational center coinciding with each other.

6. The apparatus of claim 5, wherein the second rotary shaft is provided so as to surround the first rotary shaft configured to rotate the substrate holder, and the second rotary shaft comprises a rotary table on which the inner tube is mounted.

7. The apparatus of claim 6, wherein the first rotary shaft and the second rotary shaft are configured to be rotatable independently of one another through a magnetic fluid seal.

8. The apparatus of claim 7, further comprising: an injector provided in a predetermined region inside the reaction tube to vertically extend along an inner peripheral surface of a side surface of the reaction tube and configured to supply a processing gas, and
wherein the inner tube is arranged inside the reaction tube so that the first opening faces the injector.

9. The apparatus of claim 8, further comprising:
a controller configured to control operations of the lid, the first rotary shaft and the second rotary shaft; and
a transfer device configured to transfer the plurality of substrates into the substrate holder,
wherein the controller rotates the rotary table so that the first opening faces the transfer device when the substrate holder is transferred into the inner tube mounted on the rotary table provided on the lid, and
after the plurality of substrates are transferred into the substrate holder inside the inner tube, rotates the rotary table so that the first opening of the inner tube is oriented in a direction in which the injector is arranged, and moves upward the lid to close the lower end opening in a state in which the first opening is oriented in the direction in which the injector is arranged.

10. The apparatus of claim 9, wherein the plurality of substrates are processed by supplying the processing gas from the injector while rotating the first rotary shaft to rotate the substrate holder, in a state where the rotation of the second rotary shaft is stopped to bring the inner tube into a stationary state.

11. The apparatus of claim 9, wherein the inner tube has protruded surfaces vertically extending to surround the injector from right and left sides, the protruded surfaces being formed in right and left end portions extending in a vertical direction of the first opening.

12. The apparatus of claim 11, wherein the reaction tube has protruded walls formed on an inner periphery thereof to extend outward of the protruded surfaces, and a combination of the protruded walls and the protruded surfaces constitutes a labyrinth structure.

13. The apparatus of claim 8, further comprising: a center tube provided between the inner tube inside the reaction tube and the reaction tube and configured to cover the first opening from an outside of the inner tube, the center tube having an opening formed at a position corresponding to the second opening.

14. The apparatus of claim 8, further comprising: a gas release prevention member provided below the first opening and configured to prevent the processing gas from flowing downward.

15. A method of loading a plurality of substrates, the method comprising:
transferring the plurality of substrates into a substrate holder through a second opening formed on a side surface of an inner tube, wherein the inner tube is mounted on a rotary table provided on a lid disposed below a cylindrical reaction tube, the substrate holder is configured to hold the plurality of substrates at vertical intervals in multiple stages, the cylindrical reaction tube has a first opening formed in a lower portion thereof;
rotating the rotary table so that the second opening is located at a position facing an injector provided inside the reaction tube in a plan view; and
moving upward the lid to close the first opening with the lid in a state where the second opening is oriented toward the injector.

16. A method of processing a plurality of substrates, the method comprising:
loading the substrate holder and the inner tube into the reaction tube by the method of claim 15; and
processing the plurality of substrates by supplying a processing gas from the injector while rotating the substrate holder by a second rotary shaft, wherein a center of the second rotary shaft coincides with that of a first rotary shaft configured to rotate the rotary table.

* * * * *